(12) United States Patent
Cheng et al.

(10) Patent No.: US 7,326,912 B2
(45) Date of Patent: Feb. 5, 2008

(54) CONTACT IMAGE-SENSING MODULE HAVING FINGERPRINT SCANNING FUNCTION

(75) Inventors: Chia-Chu Cheng, Taipei (TW); Tzu-Heng Liu, Taipei (TW); Ming-Ho Wang, Taipei (TW)

(73) Assignee: Lite-On Semiconductor Corp., Taipei (TW)

( * ) Notice: Subject to any disclaimer, the term of this patent is extended or adjusted under 35 U.S.C. 154(b) by 266 days.

(21) Appl. No.: 11/259,124

(22) Filed: Oct. 27, 2005

(65) Prior Publication Data
US 2006/0133655 A1    Jun. 22, 2006

(30) Foreign Application Priority Data
Dec. 21, 2004   (TW) .............................. 93220607 U

(51) Int. Cl.
*H01L 27/00* (2006.01)
*G06K 9/00* (2006.01)

(52) U.S. Cl. ..................... 250/221; 250/208.1; 356/71; 382/124

(58) Field of Classification Search ............. 250/208.1, 250/221; 382/124–127; 356/71
See application file for complete search history.

(56) References Cited

U.S. PATENT DOCUMENTS

| 5,621,516 | A | * | 4/1997 | Shinzaki et al. | ............... 356/71 |
|---|---|---|---|---|---|
| 6,011,860 | A | * | 1/2000 | Fujieda et al. | ............... 382/126 |
| 6,259,108 | B1 | * | 7/2001 | Antonelli et al. | ............ 250/556 |
| 6,294,776 | B2 | * | 9/2001 | Miksch et al. | ............ 250/208.1 |
| 6,355,937 | B2 | * | 3/2002 | Antonelli et al. | ............ 250/556 |
| 6,627,871 | B2 | * | 9/2003 | Iwamoto et al. | ............ 250/221 |
| 6,628,813 | B2 | * | 9/2003 | Scott et al. | .................. 382/124 |
| 7,054,471 | B2 | * | 5/2006 | Tschudi | ....................... 382/124 |
| 7,103,201 | B2 | * | 9/2006 | Scott et al. | .................. 382/124 |
| 7,110,577 | B1 | * | 9/2006 | Tschudi | ....................... 382/124 |
| 2004/0208346 | A1 | * | 10/2004 | Baharav et al. | ............. 382/124 |
| 2004/0208347 | A1 | * | 10/2004 | Baharav et al. | ............. 382/124 |
| 2004/0208348 | A1 | * | 10/2004 | Baharav et al. | ............. 382/124 |

* cited by examiner

*Primary Examiner*—Davienne Monbleau
(74) *Attorney, Agent, or Firm*—Rosenberg, Klein & Lee

(57) ABSTRACT

A contact image-sensing module having fingerprint-scanning function is described. The image-sensing module has a flex/rigid composite substrate having a first rigid circuit substrate, a second rigid circuit substrate, a third rigid circuit substrate, and at least one flex circuit board. The first rigid circuit substrate, the second rigid circuit substrate, and the third rigid circuit substrate respectively and electrically connect to the flex circuit board in order to form a first composite substrate, a second composite substrate, and a third composite substrate. Each of the second composite substrate and the third composite substrate respectively is not located in the same plane and has a predetermined angle with respect to the plane where the first composite plane is located.

19 Claims, 10 Drawing Sheets

CONTACT IMAGE-SENSING MODULE HAVING FINGERPRINT SCANNING FUNCTION

BACKGROUND OF THE INVENTION

1. Field of the Invention

The present invention relates to a contact image-sensing module, and more particularly, to a contact image-sensing module having a fingerprint-scanning function.

2. Description of the Prior Art

An individual's fingerprint is unique, and thus has gradually become one viable option with higher security protection when serving as the individual's password. Along with the popularity of electronic devices and the increase in storage volume thereof, protection of the personal information stored therein against unauthorized invasion becomes more and more important. As the result, having the individual's fingerprint serve as the password for use of electronic devices is becoming a more effective way of protecting personal information from unauthorized use.

Reference is made to FIG. 1, which shows a schematic, cross-sectional view of a prior art image-sensing module with fingerprint scanning function. The image-sensing module includes a rigid circuit substrate 71, a linear sensing element array 72, a plurality of light sources 73, a focusing device 74, and a light penetrating device 75. The linear element array 72 and light sources 73 are located on the rigid circuit substrate 71. The light penetrating device 75 is for placing a fingerprint 9 thereon. Light emitted from the light source 73 travels upwardly to the light penetrating device 75 and is reflected to the focusing device 74 by the fingerprint 9. The focusing device 74 focuses the light upon the linear sensing element array 72, which further processes the light in order to finish the fingerprint authorization task.

However, having the linear sensing element array 72 and light sources 73 on the rigid circuit substrate 71 leads to a bigger image-sensing module, contrary to current trends of increasingly minimized electronic devices. Additionally, the focusing device 74 has to be appropriately positioned somewhere so as to have the light travel to the linear sensing element array 72, leaving less room for positioning error and demanding higher assembly accuracy, both of which seriously and negatively affect the product yield.

Reference is made to FIG. 2, which is a schematic, cross-sectional view along the line 2-2 of the prior art image-sensing module shown in FIG. 1. Light sources 73 are placed under the light penetrating device 75. However, the light intensity of these light sources 73 projecting upon the light penetrating device 75 is not uniform, leading to a more complicated fingerprint image processing and thus undermining the processing efficiency. Furthermore, because of the use of a large number of light sources, the power consumption increases and shortens the lifetime of the whole image-sensing module.

SUMMARY OF THE INVENTION

It is an object of the present invention to provide a contact image-sensing module occupying a smaller space in order to be a better fit current trends of increasingly miniaturized electronic devices.

In accordance with the claimed invention, a contact image-sensing module having fingerprint-scanning function is provided. The present invention image-sensing module includes a flex/rigid composite substrate having a first rigid circuit substrate, a second rigid circuit substrate, a third rigid circuit substrate, and at least one flex circuit board. The first rigid circuit substrate, the second rigid circuit substrate, and the third rigid circuit substrate respectively and electrically connect to the flex circuit board in order to form a first composite substrate, a second composite substrate, and a third composite substrate. Neither the second composite substrate nor the third composite substrate is positioned in the same plane, and each has a predetermined angle with respect to the plane where the first composite plane is located. The present invention image-sensing module further includes a linear sensing element array on the second composite substrate, a light source on the third composite substrate, a focusing device axially parallel to the linear sensing element array, and a light-guiding device axially parallel to the linear sensing element array. The light source is adjacent to one end of the light-guiding device and the focusing device is located between the light-guiding device and the linear sensing element array.

By properly positioning the first, second, third rigid circuit substrate, and the flex circuit board, the present invention image-sensing module has a slant linear image element array with a predetermined angle with respect to the plane where the first composite substrate is located, so as to minimize the whole size of the module and increase room for error for the light traveling path of the light source. Moreover, the light projected upon the fingerprint is more uniform, thus reducing the number of the required light sources and the power consumption.

It is an advantage of the present invention that, with the image-sensing module according to the present invention having the fingerprint-scanning function, the light emitted from the light source takes a path with greater room for error when traveling to the sensing element, in order to further increase the product yield of the whole image-sensing module.

It is another advantage of the present invention that, with the image-sensing module according to the present invention, the light projected upon the fingerprint is more uniform so as to increase the fingerprint image processing efficiency.

It is another advantage of the present invention that fewer light sources are needed and power consumption is lower than in prior art so as to achieve the purpose of reducing the cost of the whole image-sensing module and extending the lifetime thereof.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

Figure 1:
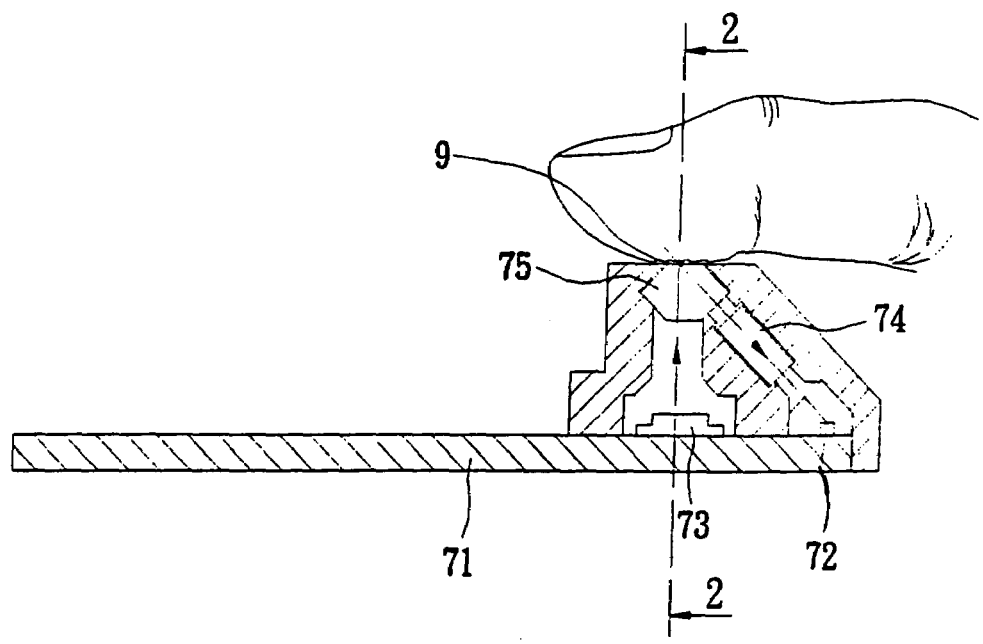
FIG. 1 is a schematic diagram showing a prior art contact image-sensing module with the fingerprint-scanning function.
Figure 2:
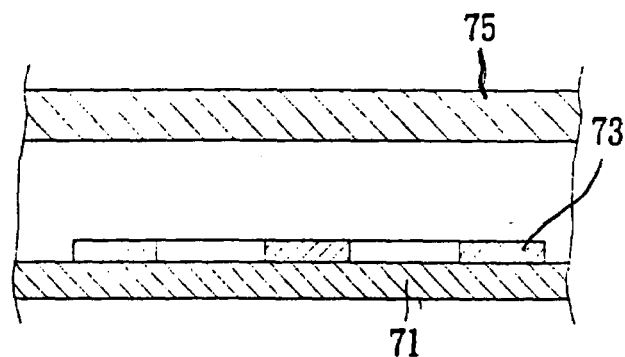
FIG. 2 is a cross-sectional view along the line 2-2 of the image-sensing module shown in FIG. 1.
Figure 3:
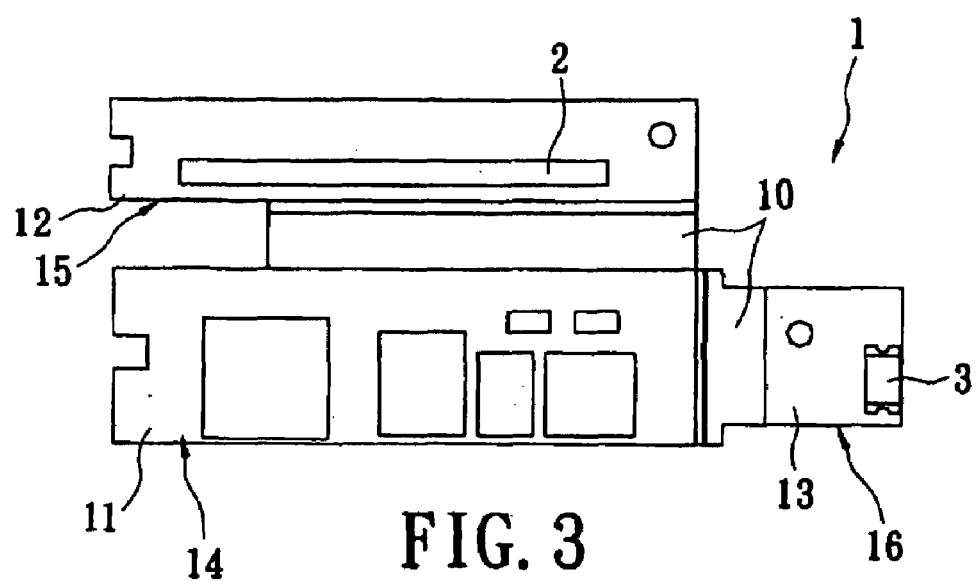
FIG. 3 is a top view of the flex/rigid composite substrate, linear sensing array, and the light source of the first embodiment of the contact image-sensing module having the fingerprint-scanning function according to the present invention.

Reference is made to FIGS. 3 to 10 of schematic diagrams and top views showing the first embodiment according to the present invention. The first embodiment includes a flex/rigid composite substrate 1, a linear sensing element array 2, a light source 3, a focusing device 4, and a light-guiding device 5. The flex/rigid composite substrate 1 includes a first rigid circuit substrate 11, a second rigid circuit substrate 12, a third rigid circuit substrate 13, and at least one flex circuit board 10. Each of first rigid circuit substrate 11, the second rigid circuit substrate 12, and the third rigid circuit substrate 13 electrically connects to at least one flex circuit board 10 and stacks with the associated flex circuit board 10 in order to form a first composite substrate 14, a second composite substrate 15, and a third composite substrate 16. The flex circuit board 10 connected to the first composite substrate 14 and the second composite substrate 15 can be either the same flex circuit board 10 connected to the first composite substrate and the third composite substrate 16, or not.

Figure 4:
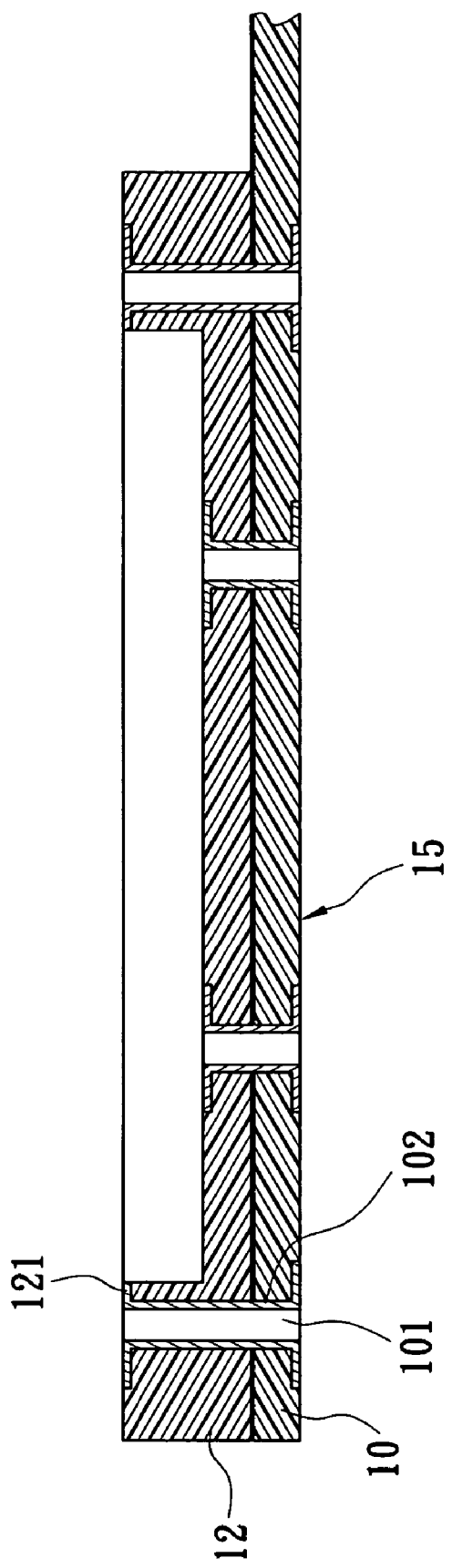
FIG. 4 is a part of a cross-sectional view of the flex/rigid composite substrate according to the first embodiment of the present invention.
Figure 5:
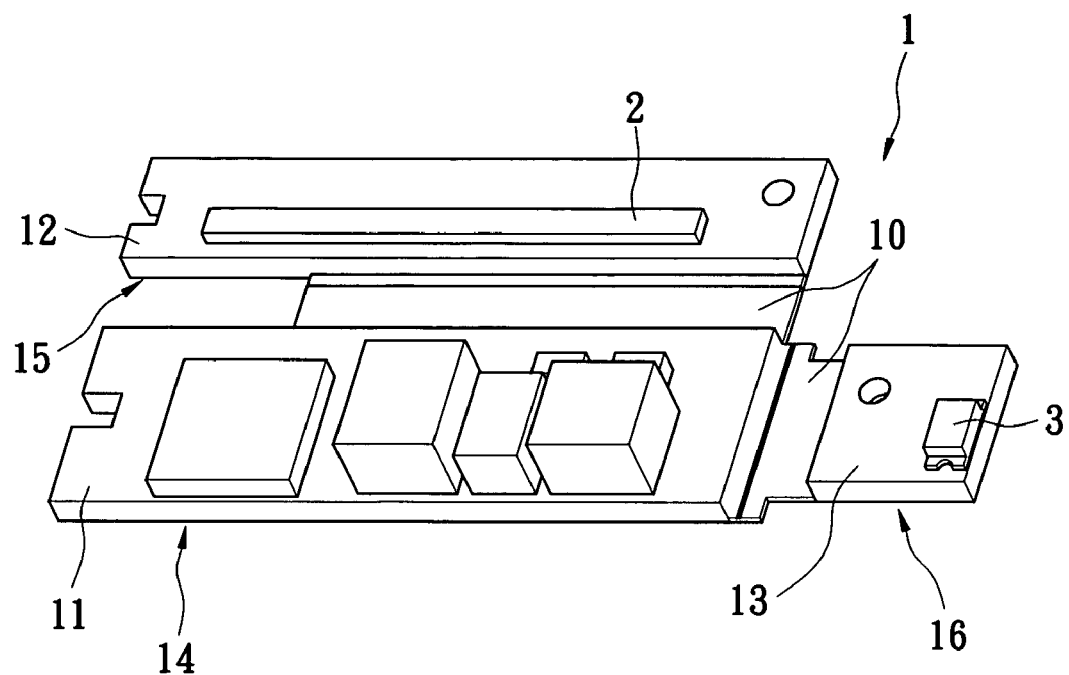
FIG. 5 is a schematic diagram of the first embodiment flex/rigid composite substrate, linear sensing element array, and light source.
Figure 6:
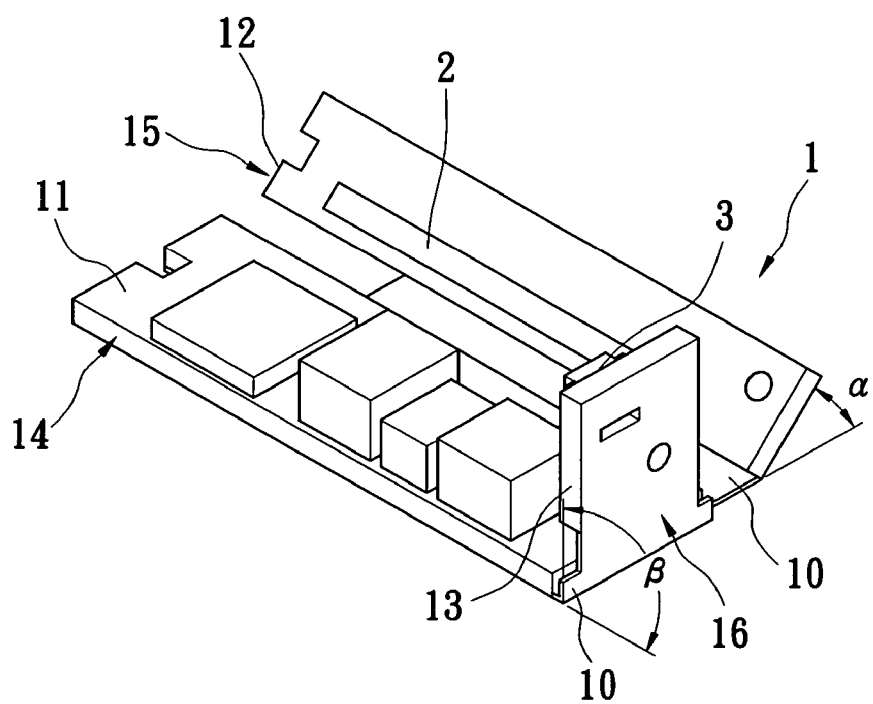
FIG. 6 is another schematic diagram showing the first embodiment flex/rigid composite substrate, linear sensing element array, and light source.
Figure 7:
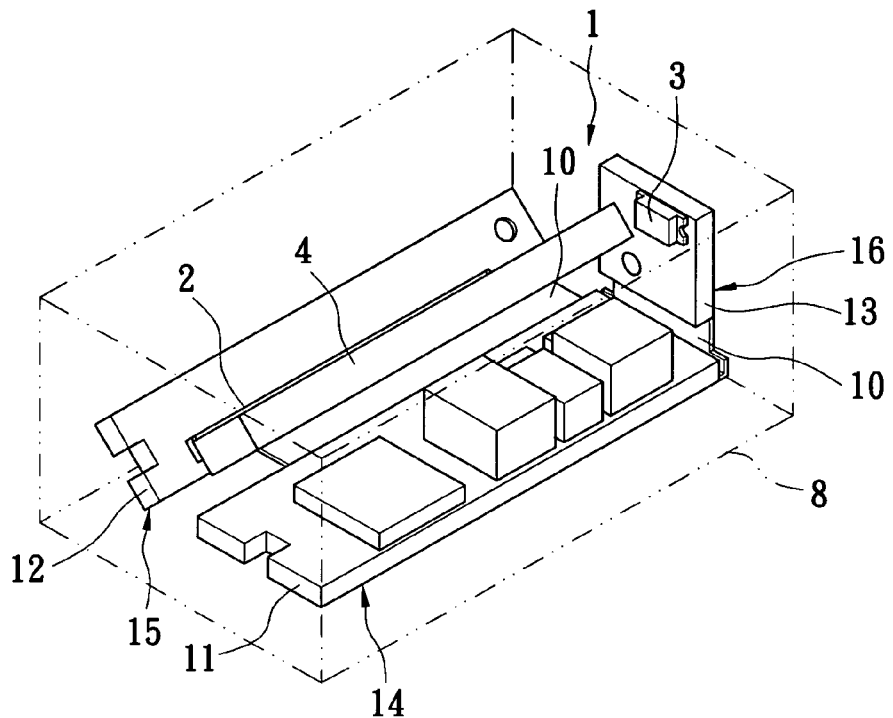
FIG. 7 is a schematic diagram showing the first embodiment flex/rigid composite substrate, linear sensing element array, light source, and focusing device.
Figure 8:
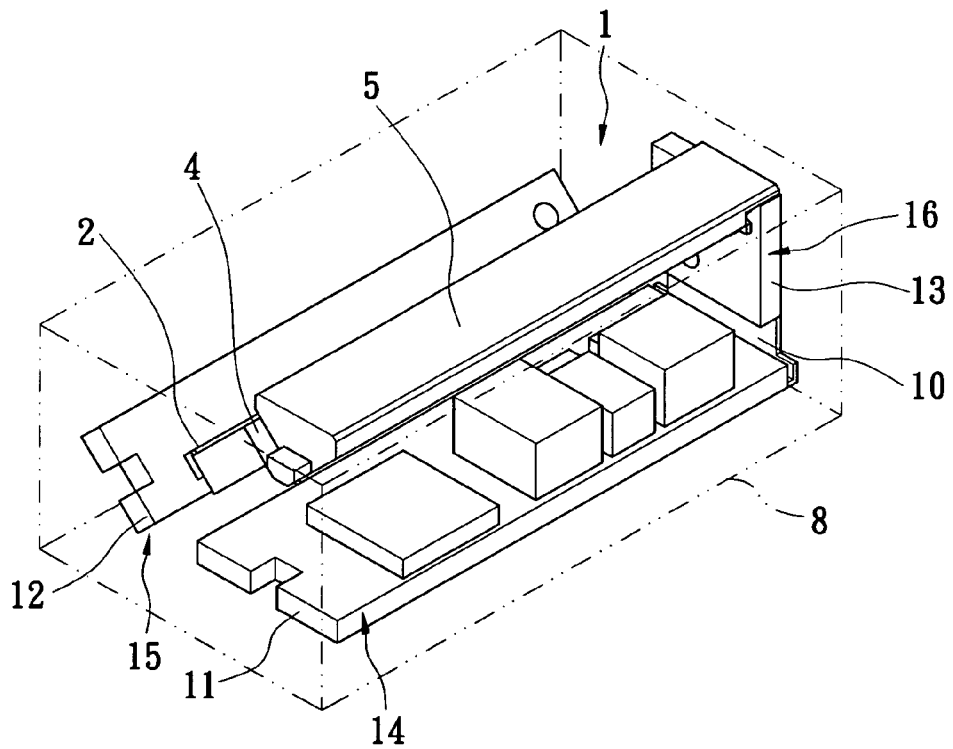
FIG. 8 is a schematic diagram of the first embodiment image-sensing module according to the present invention.
Figure 9:
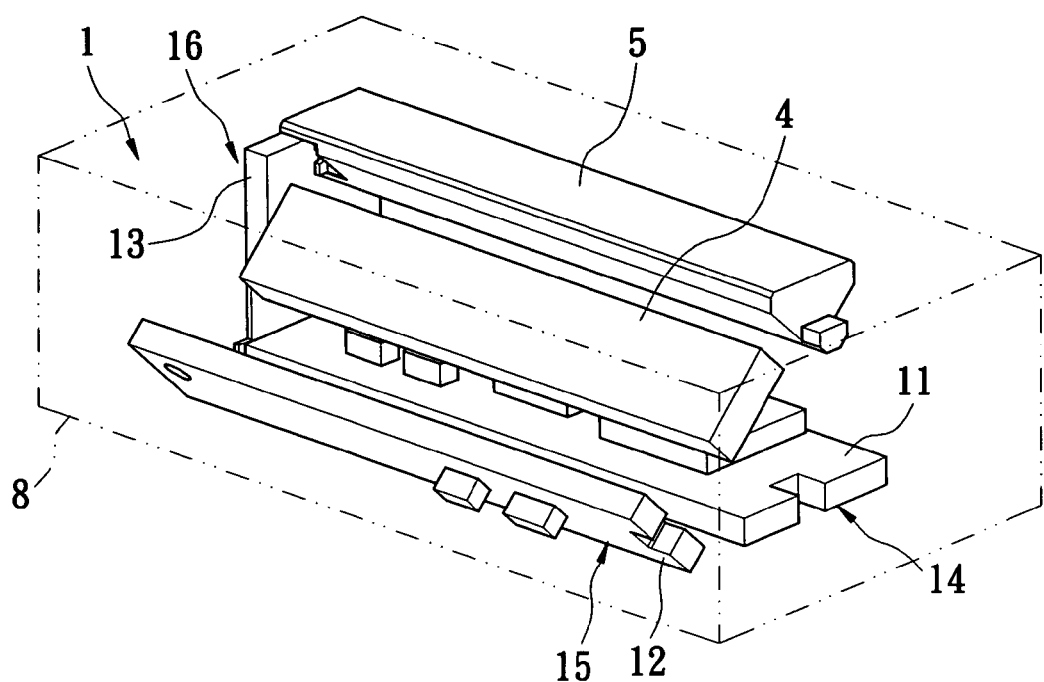
FIG. 9 is another schematic diagram showing the first embodiment of the present invention.

FIG. 4 is a schematic diagram showing the flex/rigid composite substrate 1. Each of the first composite substrate (not shown), the second composite substrate 15, and the third composite substrate (not shown either) includes a plurality of through holes 101 and a plurality of electrically-conductive elements 102. Each electrically-conductive element 102 is positioned on the inner surface of the through hole 101 and is electrically connected to the first rigid circuit substrate (not shown), at least one flex circuit board 10, the second rigid circuit substrate 12, at least one flex circuit board 10, the third rigid circuit substrate (not shown), and at least one flex circuit board 10. The second rigid circuit substrate 12 of the second composite substrate 15 further includes a plurality of contact pads 121, each electrically connected to its corresponding electrically conductive element 102.

The second composite substrate 15 and the third composite substrate 16 do not remain in the same plane and rise upwardly with a predetermined angle α and β, respectively, with respect to the plane where the first composite substrate 14 is located. In the present embodiment, the second composite substrate rises upwardly (counting from assuming the second composite substrate is in the same plane where the first composite substrate is located) with 45 degrees of the predetermined angle (α), while the third composite substrate 16 rises upwardly with 90 degrees of the predetermined angle (β). In other words, the third composite substrate 16 is perpendicular to the plane where the first composite 14 is located. However, the predetermined angles α and β range between 0 and 90 degrees (more than 0) as long as these three composite substrates are suitably positioned together.

The linear sensing element array 2 is for fetching the fingerprint image consisting of a plurality of image segments in a sequential manner. The linear sensing element array 2 is located on the second composite substrate 15 and includes a plurality of contact image sensors (CIS). The linear sensing element array electrically connects to the second rigid circuit substrate 12 and those contact pads 121 of the second composite substrate 15 in the form of chip-on-board (COB) and to the first rigid circuit substrate 11 of the first composite substrate 14 by at least one flex circuit board 10.

The light source 3, preferably a light emitting diode, is placed on the third composite substrate 16 and electrically connects to the third rigid circuit substrate 13 of the third composite substrate 16 in the form of chip-on-board (COB) and to the first rigid circuit substrate 11 of the first composite substrate 14 by at least one flex circuit board 10.

The focusing device 4, preferably a lens, is axially parallel to the linear sensing element array 2. The light-guiding device 5, preferably a light penetrating pole, is axially parallel to the linear sensing element array 2 also and has one end adjacent to the light source 3. The focusing device 4 is between the light-guiding device 5 and the linear sensing element array 2. The light-guiding device 5 axially forms a light reflecting surface 50 and a light penetrating surface 51. The light reflecting surface 50 is for having a fingerprint 9 placed thereon and the light penetrating surface 51 corresponds to the focusing device 4. The focusing device 4 and the light-guiding device 5 are mounted upon the casing 8 of any given electronic device while the focusing device 4 is monolithically connected with the light-guiding device 5.

Figure 10:
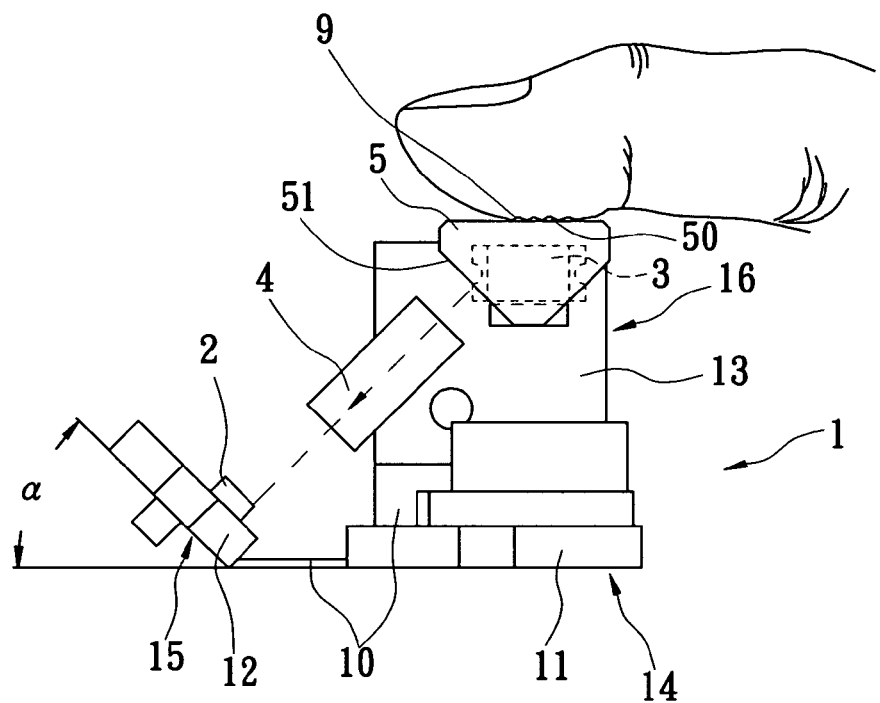
FIG. 10 is a cross-sectional view of the first embodiment according to the present invention.
Figure 11:
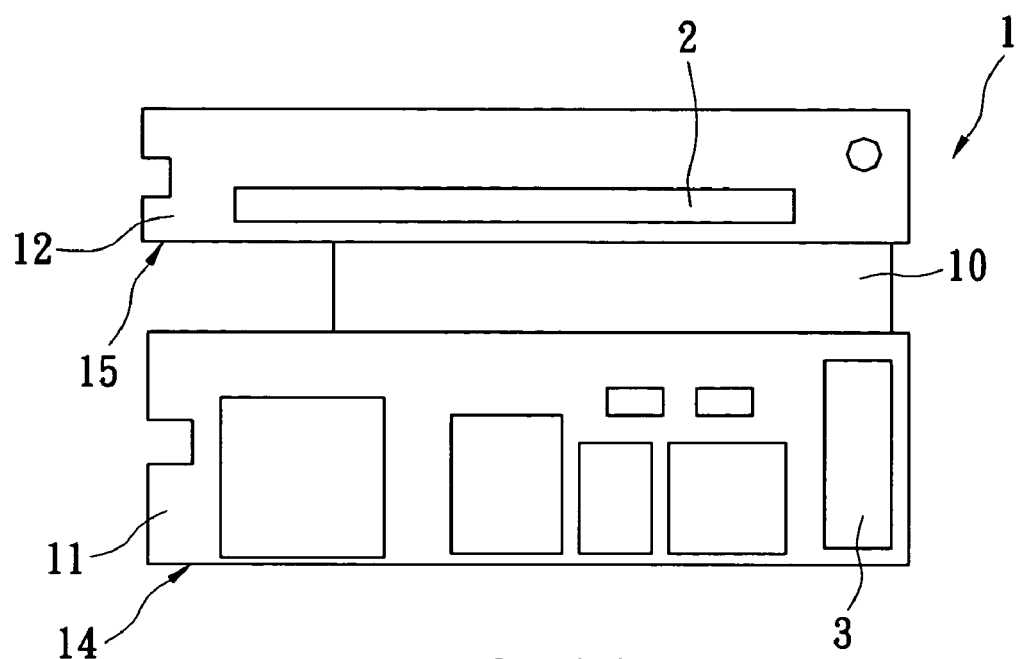
FIG. 11 is a top view showing the flex/rigid composite substrate and linear sensing element array of the second embodiment according to the present invention.
Figure 12:
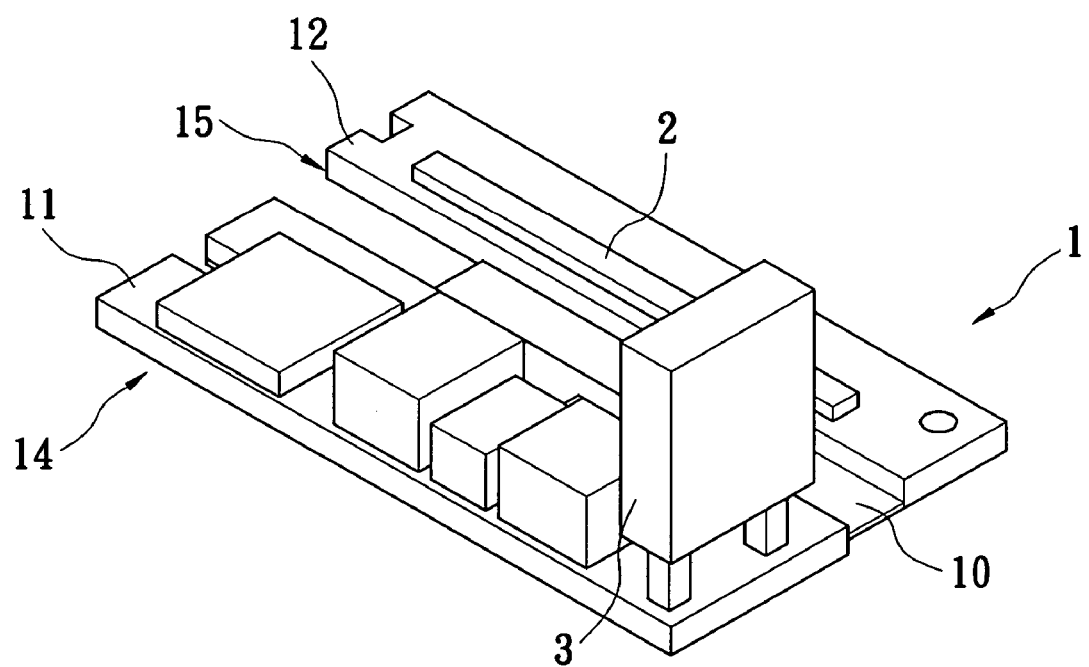
FIG. 12 is a schematic diagram showing the second embodiment flex/rigid composite substrate, linear sensing element array, and light source.
Figure 13:
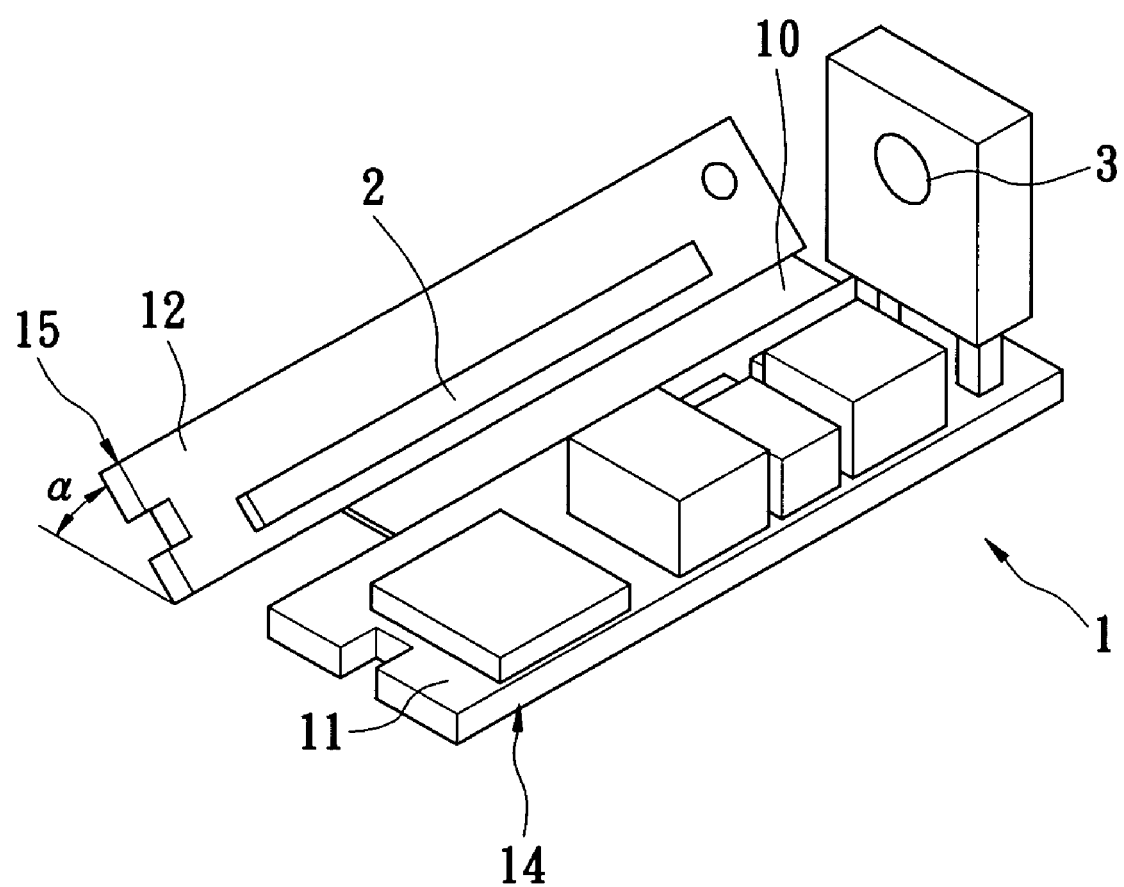
FIG. 13 is another schematic diagram showing the second embodiment flex/rigid composite substrate, linear sensing element array, and light source.
Figure 14:
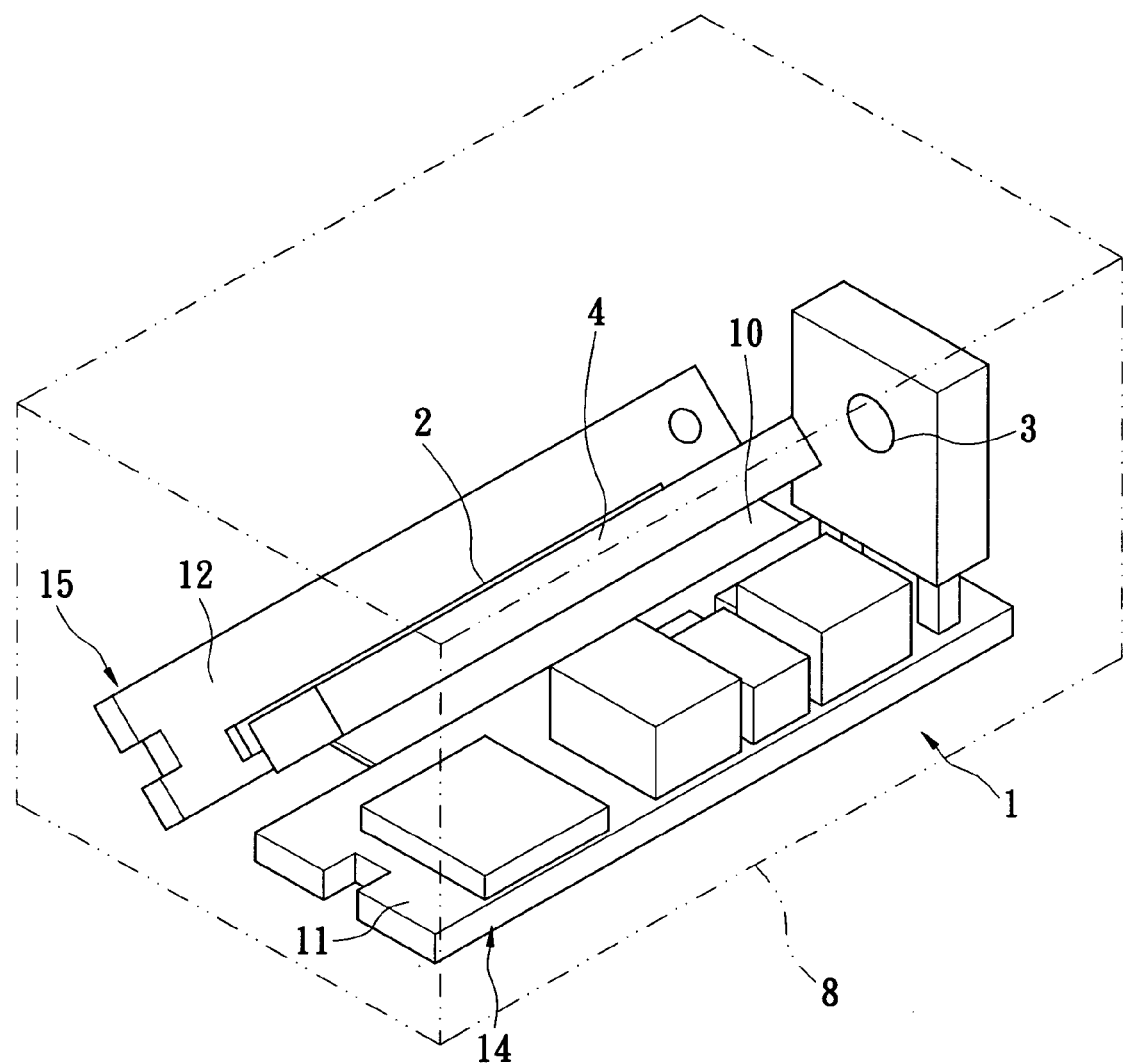
FIG. 14 is a schematic diagram showing the second embodiment flex/rigid composite substrate, linear sensing element array, light source, and focusing device.
Figure 15:
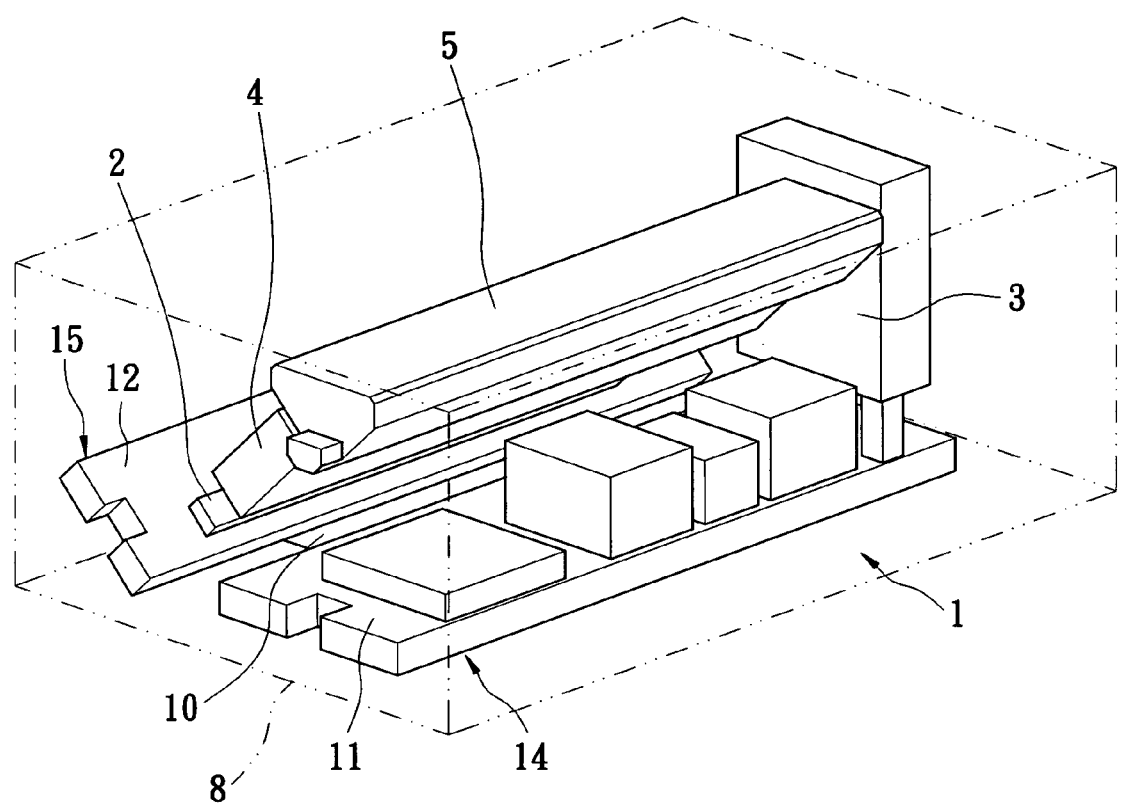
FIG. 15 is a schematic diagram showing the second embodiment according to the present invention.

Reference is made to FIG. 10. The fingerprint 9 is moved horizontally with respect to the present invention image-sensing module along the light reflecting surface 50 and the light of the light source 3 is projected upon one end of the light-guiding device 5 to have the light-guiding device 5 uniformly guide the light into itself. The fingerprint 9 reflects the light through the light penetrating surface 51 to the focusing device 4. The focusing device 4 further focuses the light on the linear sensing element array 2 and processes the focused light sequentially so as to integrate the segmental fingerprint images into a whole fingerprint image for finishing the fingerprint authorization task.

Because the flex circuit board 10 of the flex/rigid composite substrate 1 is bendable, enabling the linear sensing element array 2 to have a predetermined angle with respect to the plane where the flex circuit board 10 is located, the overall height and longitudinal depth can be reduced, further minimizing the entire size of the image-sensing module according to the present invention and facilitating the integration of the image-sensing module into increasingly miniaturized electronic devices. Besides, because the room for error of the light path of the light source 3 increases, the product yield at the same time significantly improves.

With the addition of the light-guiding device 5 capable of guiding the light, the image-sensing module according to the present invention requires fewer light sources 3 so as to generate a more uniformly emitted light. As long as the number of light sources is reduced, the total cost of the image-sensing module and the power consumption thereof are reduced accordingly.

Reference is made to FIGS. 11 to 15, which are schematic diagrams showing the second preferred embodiment of the present invention. The major difference between the first and second embodiments lies in the flex/rigid composite substrate 1 and light sources 3. In the present embodiment, the flex/rigid composite substrate 1 includes a first rigid circuit substrate 11, a second rigid circuit substrate 12, and a flex circuit board 10. The first rigid circuit substrate 11 and the second rigid circuit substrate 12 electrically connect to the flex circuit board 10, and each respectively stacks together with the flex circuit board 10 to form a first composite substrate 14 and a second composite substrate 15. The second composite substrate 15 rises upwardly with a predetermined angle α with respect to the plane on which the first composite substrate 14 is located. The light source 3 electrically connects to the first rigid circuit substrate 11 of the first composite substrate 14 in a dual-in-line-package (DIP) manner. As the result, the light source 3 can be placed upon the first composite substrate 14 directly, and, by doing so, this embodiment may achieve the same purpose that the previous embodiment has accomplished.

In contrast to the prior art, the present invention has following advantages: (1) the linear sensing element array is slantingly positioned because of the structural characteristic of the flex/rigid composite substrate so as to minimize the whole size of the image-sensing module and make the integration of the module into the electronic device easier; (2) the room for error of the light path and the product yield increase because the linear sensing element array is slantingly positioned; (3) with the addition of the light-guiding device and the structure thereof, the light projected upon the fingerprint is more uniformly emitted, increasing the fingerprint image processing efficiency; and (4) with the addition of the light-guiding device, the required number of light sources and the power consumption is reduced in order to reduce the overall cost of the present invention module and extend the lifetime thereof.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A contact image-sensing module having fingerprint scanning functions, comprising:
    a flex/rigid composite substrate having a first rigid circuit substrate, a second rigid circuit substrate, a third rigid circuit substrate, and at least one flex circuit board, wherein the first rigid circuit substrate, the second rigid circuit substrate, and the third rigid circuit substrate are respectively and electrically connected to the flex circuit board in order to form a first composite substrate, a second composite substrate, and a third composite substrate, each of the second composite substrate and the third composite substrate respectively not being positioned in a same plane and having a predetermined angle with respect to a plane where the first composite plane is located;
    a linear sensing element array on the second composite substrate;
    a light source on the third composite substrate;
    a focusing device axially parallel to the linear sensing element array; and
    a light-guiding device axially parallel to the linear sensing element array;
    wherein the light source is adjacent to one end of the light-guiding device and the focusing device is located between the light-guiding device and the linear sensing element array.

2. The contact image-sensing module in claim 1, wherein each of the first composite substrate, the second composite substrate, and the third composite substrate has a plurality of through holes and electrically-conductive elements each positioned on an inner surface of a corresponding through hole and electrically connected to the first rigid circuit substrate and at least a corresponding flex circuit board associated therewith, the second rigid circuit substrate and the corresponding flex circuit board associated therewith, and the third rigid circuit substrate and at least a flex circuit board associated therewith.

3. The contact image-sensing module in claim 1, wherein the second composite substrate rises upwardly with about 45 degrees of the predetermined angle with respect to the plane where the first composite substrate is located.

4. The contact image-sensing module in claim 1, wherein the third composite substrate is positioned perpendicularly to the first composite substrate.

5. The contact image-sensing module in claim 1, wherein the linear sensing element array electrically connects to the second rigid circuit substrate in the form of chip-on-board (COB).

6. The contact image-sensing module in claim 1, wherein the linear sensing element array includes a plurality of contact image-sensing elements.

7. The contact image-sensing module in claim 1, wherein the light source electrically connects to the third rigid circuit substrate in the form of chip-on-board (COB).

8. The contact image-sensing module in claim 1, wherein the light source is a light emitting diode.

9. The contact image-sensing module in claim 1, wherein the focusing device is a lens.

10. The contact image-sensing module in claim 1, wherein the light-guiding device axially includes a reflecting surface and a light penetrating surface, wherein the reflecting surface is for having a fingerprint placed thereon and the light penetrating surface corresponds to the focusing device.

11. A contact image-sensing module having fingerprint scanning functions, comprising:
    a flex/rigid composite substrate having a first rigid circuit substrate, a second rigid circuit substrate, and a flex circuit board, the first rigid circuit substrate and the second rigid circuit substrate electrically connecting to the flex circuit board in order to form a first composite substrate and a second composite substrate, the second composite substrate not being located in a same plane as the first composite substrate and having a predetermined angle with respect to a plane where the first composite substrate is located;

a linear sensing element array on the second composite substrate;

a light source on the first composite substrate;

a focusing device axially parallel to the linear sensing element array; and a light-guiding device axially parallel to the linear sensing element array; wherein the light source is adjacent to one end of the light-guiding device and the focusing device is positioned between the light-guiding device and the linear sensing element array.

12. The contact image-sensing module in claim 11, wherein each of the first composite substrate and the second composite substrate includes a plurality of through holes and a plurality of electrically-conductive elements, wherein each of the electrically conductive elements is positioned on an inner surface of a corresponding through hole so as to electrically connect to the first rigid circuit substrate and the flex circuit board associated therewith, and the second composite substrate and the flex circuit board associated therewith.

13. The contact image-sensing module in claim 11, wherein the second composite substrate rises upwardly with about 45 degrees of the predetermined angle with respect to the plane where first composite substrate is located.

14. The contact image-sensing module in claim 11, wherein the linear sensing element array electrically connects to the second rigid circuit substrate in the form of chip-on-board (COB).

15. The contact image-sensing module in claim 11, wherein the linear sensing element array includes a plurality of contact image-sensing elements.

16. The contact image-sensing module in claim 11, wherein the light source electrically connects to the first rigid circuit substrate in a dual-in-line-package (DIP) manner.

17. The contact image-sensing module in claim 11, wherein the light source is a light emitting diode.

18. The contact image-sensing module in claim 11, wherein the focusing device is a lens.

19. The contact image-sensing module in claim 11, wherein the light-guiding device axially includes a reflecting surface and a light penetrating surface, wherein the reflecting surface is for having a fingerprint placed thereon and the light penetrating surface corresponds to the focusing device.

* * * * *